United States Patent
Chen et al.

(10) Patent No.: US 12,282,074 B1
(45) Date of Patent: Apr. 22, 2025

(54) METHOD AND APPARATUS FOR MEASURING MAGNETIC FIELD INTENSITY IN HIGH-TEMPERATURE SUPERCONDUCTING MAGLEV TRANSPORTATION SYSTEMS

(71) Applicant: Southwest Jiaotong University, Chengdu (CN)

(72) Inventors: Rong Chen, Chengdu (CN); Ping Wang, Chengdu (CN); Tao Lv, Chengdu (CN); Jingmang Xu, Chengdu (CN); Zhou Xu, Chengdu (CN); Kai Liu, Chengdu (CN); Min Xue, Chengdu (CN)

(73) Assignee: Southwest Jiaotong University, Chengdu (CN)

( * ) Notice: Subject to any disclaimer, the term of this patent is extended or adjusted under 35 U.S.C. 154(b) by 0 days.

(21) Appl. No.: 18/838,852

(22) PCT Filed: Apr. 25, 2024

(86) PCT No.: PCT/CN2024/089770
§ 371 (c)(1),
(2) Date: Aug. 15, 2024

(30) Foreign Application Priority Data

Dec. 8, 2023 (CN) .......................... 202311677088.6

(51) Int. Cl.
*G01R 33/00* (2006.01)
*B60L 13/04* (2006.01)
(Continued)

(52) U.S. Cl.
CPC .......... *G01R 33/0094* (2013.01); *B60L 13/04* (2013.01); *B61B 13/08* (2013.01);
(Continued)

(58) Field of Classification Search
CPC .... G01R 33/0094; G01R 33/07; G01R 33/10; B60L 13/04; B61B 13/08; B61D 15/08
See application file for complete search history.

(56) References Cited

U.S. PATENT DOCUMENTS 10,604,898 B2 * 3/2020 Noe .................. B61B 13/08
11,552,580 B1 * 1/2023 Zheng ............... B60L 13/04
(Continued)

OTHER PUBLICATIONS

CN 202311677088.6, Grant of Notice of Patent Right for Invention, mailed Jan. 31, 2024, 3 pages. (with English translation).

*Primary Examiner* — Alvaro E Fortich
(74) *Attorney, Agent, or Firm* — Getech Law LLC; Jun Ye

(57) ABSTRACT

The present invention relates to the technical field of maglev transportation, specifically revealing a method and apparatus for measuring magnetic field intensity in high-temperature superconducting maglev transportation systems. The method includes: Establishing the top surface of the permanent magnet guideway (PMG) as the reference datum for magnetic field intensity measurements; developing a multi-point chord measurement system with parameters including system sampling interval, system order, and chord measurement configuration; computing intermediate chord values; constructing an inversion model incorporating the least squares method and employing this model to derive the vertical displacement of the reference chord baseline; determining gap sensor locations and deploying an array of Hall effect sensors along the direction of magnetic field intensity measurement; adjusting the reference datum position; and calculating the magnetic field intensity distribution above the reference datum using interpolation techniques based on the Hall effect sensor array measurements.

7 Claims, 3 Drawing Sheets

(51) Int. Cl.
   *B61B 13/08* (2006.01)
   *B61D 15/08* (2006.01)
   *G01R 33/07* (2006.01)
   *G01R 33/10* (2006.01)

(52) U.S. Cl.
   CPC .............. *B61D 15/08* (2013.01); *G01R 33/07* (2013.01); *G01R 33/10* (2013.01)

(56) References Cited

U.S. PATENT DOCUMENTS

| | | | |
|---|---|---|---|
| 2002/0037814 A1* | 3/2002 | Heise | B60L 13/04 505/100 |
| 2008/0029368 A1* | 2/2008 | Komori | H01L 21/67784 198/619 |
| 2022/0093300 A1* | 3/2022 | Deng | F25D 19/006 |

\* cited by examiner

METHOD AND APPARATUS FOR MEASURING MAGNETIC FIELD INTENSITY IN HIGH-TEMPERATURE SUPERCONDUCTING MAGLEV TRANSPORTATION SYSTEMS

CROSS REFERENCE OF RELATED APPLICATION

The present application is a 371 of international Application PCT/CN2024/089770, filed Apr. 25, 2024, which claims priority to Chinese Patent Application No. 202311677088.6 with the filed Dec. 8, 2023. The contents of the applications are incorporated herein by reference in their entireties.

FIELD OF THE INVENTION

The present invention relates to the technical field of magnetic levitation transportation, particularly to a method and apparatus for measuring magnetic field intensity in high-temperature superconducting maglev transportation systems.

TECHNICAL BACKGROUND

High-temperature superconducting maglev transportation systems are self-stabilizing systems that operate without active levitation or guidance control. The underlying principle is as follows: Leveraging the flux pinning effect in Type II non-ideal high-temperature superconducting materials, when a Permanent Magnet Guideway (PMG) serves as a magnetic source for high-temperature superconducting bulk materials, magnetic flux lines can be partially captured by the superconductor as they pass through pinning centers. In accordance with Lenz's law, when a high-temperature superconductor in the mixed state moves, the changing magnetic environment induces internal currents. These currents interact with the PMG to generate a pinning force that resists the superconductor's return to its initial position. This manifests as a levitation force in the vertical direction and a guidance force in the horizontal direction.

High-temperature superconducting maglev transportation systems are presently at a pivotal stage, progressing from laboratory experimentation to practical engineering implementation. In these systems, the levitation and guidance forces necessary for the safe high-speed operation of maglev vehicles are generated by the interaction between the induced magnetic field in the superconductor and the PMG magnetic field. As a result, the spatial non-uniformity of the PMG magnetic field intensity emerges as a novel challenge requiring resolution. Being the exclusive magnetic field input source in high-temperature superconducting maglev systems, irregularities in the PMG magnetic field intensity directly influence the levitation gap of the maglev vehicle. Owing to the highly non-linear relationship between the superconductor's levitation force and the levitation gap, even slight variations in the gap induced by magnetic field irregularities can result in persistent oscillations of the superconductor. Furthermore, superconductors inherently face unavoidable issues including magnetostriction, stress concentration at pinning center defects, and losses from alternating induced currents. When exacerbated by magnetic field intensity irregularities, these defects can, in severe cases, lead to the failure of the superconductor's levitation and guidance functions, thus jeopardizing the operational safety of the maglev train.

The measurement of PMG magnetic field intensity irregularities in high-temperature superconducting maglev transportation systems has consistently posed a significant challenge, impacting the entire lifecycle of the maglev system (encompassing design, optimization, construction, and operational management). In the context of high-temperature superconducting maglev transportation systems, PMG magnetic field intensity measurement results can offer crucial data support and scientific foundation for assessing PMG magnetic field intensity irregularities and optimizing PMG positioning. Consequently, there is a pressing demand for a detection method that combines high efficiency, low cost, and high precision. To enhance the PMG intensity measurement technology framework for high-temperature superconducting maglev systems, this invention introduces a magnetic field intensity measurement method and apparatus for high-temperature superconducting maglev transportation systems.

DISCLOSURE OF THE INVENTION

To resolve the existing difficulty in precisely and efficiently detecting magnetic field intensity irregularities in high-temperature superconducting maglev transportation systems, the present invention provides a magnetic field intensity measurement method and apparatus for high-temperature superconducting maglev transportation systems, which addresses the previously discussed problem of magnetic field intensity detection above the PMG.

To accomplish the aforementioned goal, the technical solution put forward by this invention is as follows: A magnetic field intensity measurement method for high-temperature superconducting maglev transportation systems, characterized by comprising the following steps:

S1. Establishing the top surface of the permanent magnet guideway (PMG) as the reference datum for magnetic field intensity measurements;

S2. Developing a chord-based multi-point measurement system to detect surface irregularities of the PMG, with system parameters including sampling interval, system order, and chord measurement configuration;

S3. Computing chord measurement values for multiple intermediate points using data from the multi-point chord measurement system, and constructing an inversion model for the measurement system employing the least squares method. The inversion model is used to reconstruct the original track irregularity waveform from chord-based measurements, where the reconstructed track irregularity represents the vertical displacement of the chord baseline;

S4. Determining gap sensor positions based on the optimal chord measurement configuration of the multi-point chord system, and deploying an array of Hall effect sensors along the direction of magnetic field intensity measurement;

S5. Adjusting the reference datum position using the vertical displacement of the chord baseline, and calculating the magnetic field intensity distribution at any height above the reference datum using interpolation techniques based on Hall effect sensor readings.

Preferably, in step S2, the system sampling interval is $\Delta s$, and the formula for computing the system order is as follows:

$$\gamma = L/\Delta s$$

Where $\gamma$ denotes the system order, L denotes the system chord length, and $\Delta s$ denotes the sampling step size.

Preferably, In step S3, the formula for calculating chord measurement values for multiple intermediate measurement points based on the multi-point chord measurement system data is expressed as:

$$G = H \cdot Z_z$$

In which G denotes the chord measurement value matrix, H denotes the measurement matrix, and $Z_z$ denotes the irregularity vector matrix of the PMG; The chord measurement value matrix G is represented as:

$$G = \begin{bmatrix} G(1) \\ G(2) \\ \vdots \\ G(n-1) \end{bmatrix} = \begin{bmatrix} g_{1,0} & g_{1,1} & \cdots g_{1,i} & \cdots g_{1,N-n-1} \\ g_{2,0} & g_{2,1} & \cdots g_{2,i} & \cdots g_{1,N-n-1} \\ \vdots & \vdots & \ddots & \vdots & \vdots \\ g_{n-1,0} & g_{n-1,1} & \cdots g_{n-1,i} & \cdots g_{n-1,N-n-1} \end{bmatrix}_{(n-1)\times(N-n)}$$

Where G(i) denotes all chord values of measurement points when the chord baseline begins at measurement point i, and $g_{n-1,i}$ denotes the chord value of measurement point $n_{-1}$ when the chord baseline begins at measurement point i;

The fully configured measurement matrix H for the chord baseline is presented as:

$$H = \begin{bmatrix} h_1[k] \\ h_2[k] \\ \vdots \\ h_{n-1}[k] \end{bmatrix} = \begin{bmatrix} \gamma_1 & 1 & \cdots & & \overline{\gamma_1} \\ \gamma_2 & & 1 & \cdots & \overline{\gamma_2} \\ \vdots & & & \ddots & \vdots \\ \gamma_{n-1} & \cdots & & 1 & \overline{\gamma_{n-1}} \end{bmatrix}_{(n-1)\times(n+1)}$$

The measurement matrix H contains n−1 rows and n+1 columns, with the number of rows corresponding to the number of measurement points in the full configuration, and the number of columns matching the dimension of the irregularity vector covered by the chord baseline, including endpoints. $h_{n-1}[k]$ is the convolution kernel for measurement point $n_{-1}$, with elements in the 1st and n+1 columns corresponding to the split ratios $\gamma_i$ and $\overline{\gamma_i}$ of measurement point i, while the middle columns from the 2nd to the n form an identity matrix of dimension n−1; The PMG irregularity vector matrix $Z_z$ corresponding to each column of the chord measurement value matrix G is expressed as:

$$Z_Z = \begin{bmatrix} z_0 & z_1 & \cdots & z_i & \cdots & z_{N-n-1} \\ z_1 & z_2 & \cdots & z_{i+1} & \cdots & z_{N-n} \\ \vdots & \vdots & \ddots & \vdots & \ddots & \vdots \\ z_n & z_{n+1} & \cdots & z_{i+1} & \cdots & z_{N-1} \end{bmatrix}$$

Where $Z_i$ represents the irregularity vector corresponding to the chord baseline position i.

Preferably, an inversion model is established using the least squares method, which is subsequently employed to reconstruct the guideway irregularity waveform. During this process, the optimal solution is derived under the condition of best approximating the guideway track irregularity, thus ensuring the accuracy of the measurement results. The formula for deriving the optimal solution is as follows:

$$\min_{z} \frac{1}{2} \|H \cdot Z^* - G\|^2$$

Where H denotes the measurement matrix, G denotes the chord measurement value matrix, and Z* denotes the optimal solution, which is the reconstructed waveform of the PMG (Permanent Magnet Guideway) irregularity.

Preferably, an operator $\zeta$ is incorporated into the inversion model of the measurement system to ensure solution stability and generate Z*, the reconstructed waveform of PMG irregularity. The operator expression is defined as:

$$\zeta = \left( \sum_{i=1}^{k} H_i^T H_i + \beta I \right)^{-1} \cdot \sum_{i=1}^{k} H_i^T$$

Where H denotes the measurement matrix, T denotes the matrix transpose operation, β denotes the regularization parameter coefficient ranging from 0.001 to 0.005, I denotes the identity matrix, and i denotes the position of the measurement point;

The reconstructed waveform is expressed as:

$$Z^* = \zeta \cdot G$$

Where Z* represents the reconstructed waveform of PMG irregularity, G represents the chord measurement value matrix, and $\zeta$ represents the operator.

Preferably, in step S4, gap sensor positions are determined based on the optimal chord measurement configuration of the multi-point chord system, and an array of Hall effect sensors is deployed along the direction of magnetic field intensity measurement; a Hall sensor measurement matrix B is obtained after placing j Hall sensors at each measurement point position;

$$B = \begin{bmatrix} B_{1,1} & B_{1,2} & \cdots & B_{1,j} \\ B_{2,1} & B_{2,2} & \cdots & B_{2,j} \\ \vdots & \vdots & \vdots & \vdots \\ B_{n-1,1} & B_{n-1,2} & \vdots & B_{n-1,j} \end{bmatrix}$$

Where $B_{n-i,j}$ denotes the measurement value of the j-th sensor in the measurement direction at measurement point n−1.

Preferably, the optimal chord measurement configuration, which determines the optimal sensor installation positions, should satisfy the following criteria: (1) The greatest common divisor of the intervals between adjacent measurement points should be 1, ensuring the stability of the measurement system and the subsequent inversion model, thus guaranteeing the accuracy of chord values and reconstructed guideway irregularities; (2) Maximize the detectable wavelength while fulfilling measurement precision requirements, thereby ensuring the applicability of measurement results; (3) Satisfy measurement error requirements, ensuring the accuracy of measurement outcomes.

Preferably, in step S5, the adjusted reference datum position is determined by subtracting the vertical displacement from the initial position of the chord baseline, and the magnetic field intensity distribution at any arbitrary height above the reference datum is computed using interpolation techniques based on the Hall effect sensor readings. The mathematical expression is as follows:

$$R^* = R - Z^*$$

$$B^* = interpl(R^*, B, s)$$

Where R* denotes the adjusted chord baseline position, R denotes the initial position, and B* denotes the interpolated magnetic field intensity at position S along the measurement direction.

Additionally, to accomplish the aforementioned goal, the present invention also puts forward the following technical solution: An apparatus for measuring magnetic field intensity in high-temperature superconducting maglev transportation systems, comprising:

A trolley main frame, running wheels, sensor mounting bracket, measurement chord mounting bracket, measurement chord, Hall sensor mounting apertures, gap sensor mounting apertures, and an encoder;

Said running wheels are attached to the trolley main frame through bearings; both the sensor mounting bracket and the measurement chord mounting bracket are rigidly affixed to the trolley main frame; the sensor mounting bracket features Hall sensor mounting apertures for secure installation of Hall sensors and gap sensor mounting apertures for secure installation of gap sensors; the measurement chord is rigidly attached to the measurement chord mounting bracket; the encoder is linked to the bearing and rotates coaxially with it.

The advantageous effects of this invention are: This invention introduces the multi-point chord measurement technique to high-temperature superconducting maglev transportation systems for the first time. In comparison with conventional inertial measurement and optical imaging methods, this approach provides superior measurement accuracy, enhanced stability, and improved resistance to external disturbances. Particularly, when the measurement apparatus traverses PMG joints, substantial impacts occur, causing the gap measurement values to reach the sensors' maximum range saturation value. This implies that as the gap sensors mounted on the multi-point chord baseline sequentially cross the joints, alternating sudden changes in gap sensor measurement amplitudes take place. When the sensors at the chord baseline extremities cross the joints, the amplitude attains the sensors' range saturation value, effectively causing the chord baseline to "fail," which would result in "distortion" of the chord values at intermediate measurement points. In the method of this invention, one merely needs to eliminate the rows in the measurement matrix corresponding to the "failed" chord baseline positions to preserve the accuracy of the measurement matrix, thus ensuring the accuracy of the reconstructed guideway irregularity waveform. This guarantees that the measurement result precision of the multi-point chord method remains unaffected by vibration and impact. The measurement apparatus devised in this invention can measure the magnetic field intensity at any location above the PMG of high-temperature superconducting maglev transportation systems. The apparatus is lightweight, easily disassembled, easily transported, cost-effective, and economically efficient.

The numerical references in the figures are defined as follows: 1—trolley main frame; 2—running wheels; 3—sensor mounting bracket; 4—measurement chord mounting bracket; 5—measurement chord; 6—Hall sensor mounting apertures; 7—gap sensor mounting apertures; 8—encoder; 11—magnetic field intensity irregularity; 12—guideway irregularity; 13—Hall sensor; 14—gap sensor.

DETAILED DESCRIPTION OF THE EMBODIMENTS

The following section will elucidate the technical solutions of the embodiments of this invention in a clear and comprehensive manner, in conjunction with the accompanying figures. Evidently, the embodiments described herein do not encompass all possible embodiments of this invention. Based on the embodiments presented in this invention, all other embodiments developed by those of ordinary skill in the pertinent field, which do not involve additional creative elements, fall within the protective scope of this invention.

Embodiment 1

Figure 1:
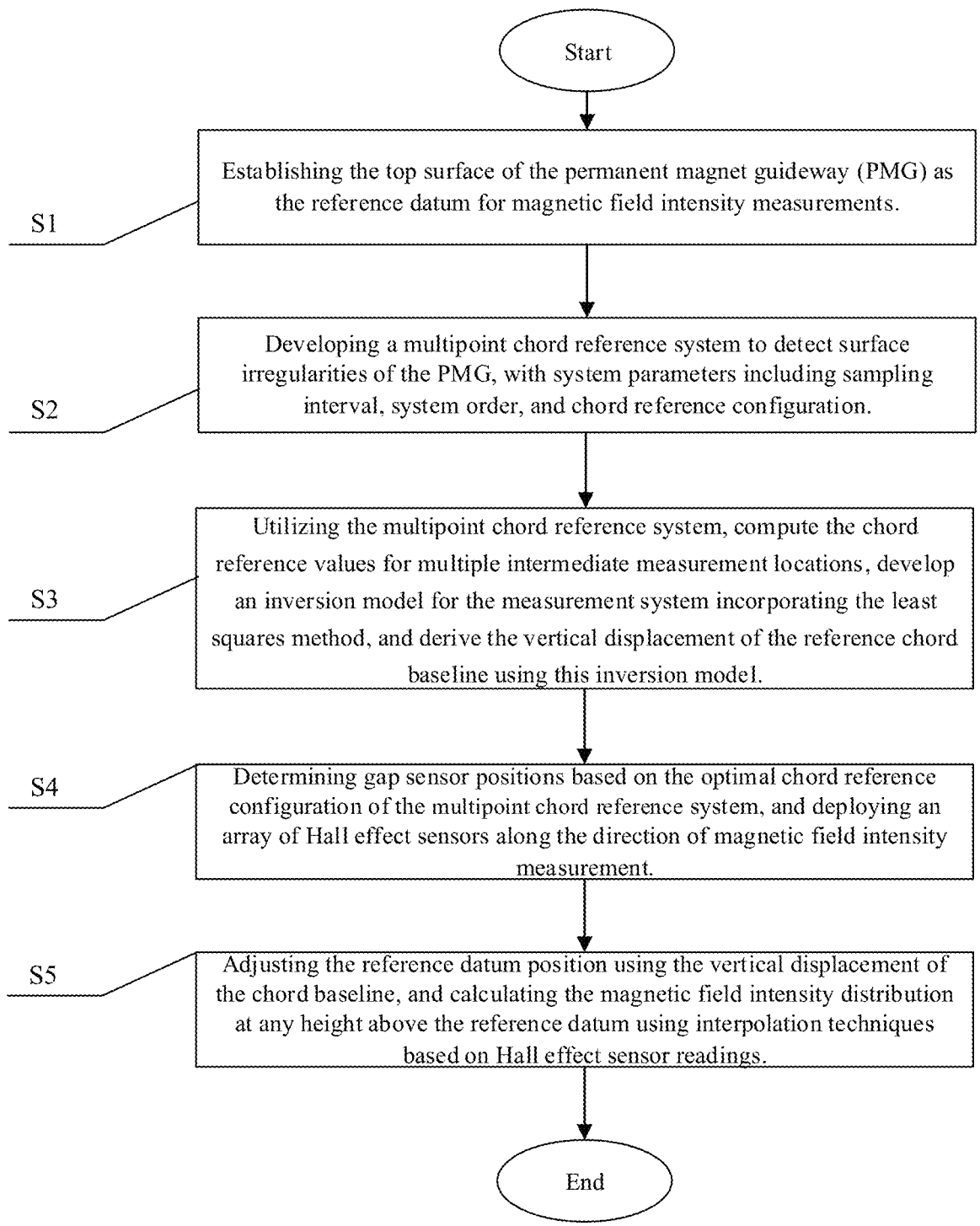
FIG. 1 presents the procedural flow of the method described in this invention.

In high-temperature superconducting maglev transportation systems, the high degree of levelness of functional components is an essential prerequisite for ensuring the safe, stable, and comfortable operation of maglev vehicles throughout the entire speed domain. The combined effects of climatic variations such as rainfall, temperature extremes, guideway foundation settlement, concrete structure creep, and cyclic loading from maglev vehicles can result in non-uniform spatial distribution of the PMG magnetic field and alterations in the planarity of the traction DC motor. Should issues arise, such as magnetic field intensity irregularities with significant rates of change, the operational safety and stability of maglev vehicles will be directly impacted. As illustrated in FIG. 1, the method proposed in this invention enables the measurement of magnetic field intensity at any location above the PMG of the high-temperature superconducting maglev system. As a magnetic field intensity measurement method for high-temperature superconducting maglev transportation systems, it is characterized by comprising the following steps:

S1. Establishing the top surface of the permanent magnet guideway (PMG) as the reference datum for magnetic field intensity measurements.

In this embodiment, to assess the magnetic field intensity distribution irregularities above the PMG of the high-temperature superconducting maglev transportation system, the upper surface of the PMG is established as the measurement reference plane. The optimal operational height for high-temperature superconducting magnetic levitation is 10 mm; consequently, in this instance, the vertical magnetic field intensity is measured at a position 10 mm above the PMG's upper surface.

S2. Developing a chord-based multi-point measurement system to detect surface irregularities of the PMG, with system parameters including sampling interval, system order, and chord measurement configuration (i.e., gap sensor installation positions);

Said system sampling interval is $\Delta s$, and the formula for computing the system order is as follows:

$$\gamma = L/\Delta s$$

Where $\gamma$ denotes the system order, L denotes the system chord length, and $\Delta s$ denotes the sampling step size.

S3, Computing chord measurement values for multiple intermediate points using data from the multi-point chord measurement system, and constructing an inversion model for the measurement system employing the least squares method. The inversion model is used to reconstruct the original track irregularity waveform from chord-based measurements, where the reconstructed track irregularity represents the vertical displacement of the chord baseline;

The formula for calculating chord measurement values for multiple intermediate measurement points based on the multi-point chord measurement system data is expressed as:

$$G = H \cdot Z_z$$

In which G denotes the chord measurement value matrix, H denotes the measurement matrix, and $Z_z$ denotes the irregularity vector matrix of the PMG;

The chord measurement value matrix G is represented as:

$$G = \begin{bmatrix} G(1) \\ G(2) \\ \vdots \\ G(n-1) \end{bmatrix} = \begin{bmatrix} g_{1,0} & g_{1,1} & \cdots g_{1,i} & \cdots g_{1,N-n-1} \\ g_{2,0} & g_{2,1} & \cdots g_{2,i} & \cdots g_{1,N-n-1} \\ \vdots & \vdots & \ddots & \vdots & \vdots \\ g_{n-1,0} & g_{n-1,1} & \cdots g_{n-1,i} & \cdots g_{n-1,N-n-1} \end{bmatrix}_{(n-1)\times(N-n)}$$

Where G(i) denotes all chord values of measurement points when the chord baseline begins at measurement point i, and $g_{n-1,i}$ denotes the chord value of measurement point n−1 when the chord baseline begins at measurement point i;

The fully configured measurement matrix H for the chord baseline is presented as:

$$H = \begin{bmatrix} h_1[k] \\ h_2[k] \\ \vdots \\ h_{n-1}[k] \end{bmatrix} = \begin{bmatrix} \gamma_1 & 1 & \cdots & \overline{\gamma_1} \\ \gamma_2 & 1 & \cdots & \overline{\gamma_2} \\ \vdots & & \ddots & \vdots \\ \gamma_{n-1} & \cdots & 1 & \overline{\gamma_{n-1}} \end{bmatrix}_{(n-1)\times(n+1)}$$

The measurement matrix H contains n−1 rows and n+1 columns, with the number of rows corresponding to the number of measurement points in the full configuration, and the number of columns matching the dimension of the irregularity vector covered by the chord baseline, including endpoints. $h_{n-1}[k]$ is the convolution kernel for measurement point n−1, with elements in the 1st and n+1 columns corresponding to the split ratios $\gamma_i$ and $\overline{\gamma_i}$ of measurement point i, while the middle columns from the 2nd to the n form an identity matrix of dimension n−1;

The PMG irregularity vector matrix $Z_z$ corresponding to each column of the chord measurement value matrix G is expressed as:

$$Z_Z = \begin{bmatrix} z_0 & z_1 & \cdots & z_i & \cdots & z_{N-n-1} \\ z_1 & z_2 & \cdots & z_{i+1} & \cdots & Z_{N-n} \\ \vdots & \vdots & \ddots & \vdots & \ddots & \vdots \\ z_n & z_{n+1} & \cdots & z_{i+1} & \cdots & z_{N-1} \end{bmatrix}$$

Where $Z_i$ represents the irregularity vector corresponding to the chord baseline position 1.

An inversion model is established using the least squares method, which is subsequently employed to reconstruct the guideway irregularity waveform. During this process, the optimal solution is derived under the condition of best approximating the guideway track irregularity, thus ensuring the accuracy of the measurement results. The formula for deriving the optimal solution is as follows:

$$\min_z \frac{1}{2} \|H \cdot Z^* - G\|^2$$

Where H denotes the measurement matrix, G denotes the chord measurement value matrix, and Z* denotes the optimal solution, which is the reconstructed waveform of the PMG (Permanent Magnet Guideway) irregularity.

When the condition number of the measurement matrix H is excessively high (termed an ill-conditioned matrix), it can result in instability of the equation solution Z*. To address this, an operator $\zeta$ is incorporated into the inversion model of the measurement system to ensure solution stability and generate Z*, the reconstructed waveform of PMG irregularity. The operator expression is defined as:

$$\zeta = \left( \sum_{i=1}^{k} H_i^T H_i + \beta I \right)^{-1} \cdot \sum_{i=1}^{k} H_i^T$$

Where H denotes the measurement matrix, T denotes the matrix transpose operation, $\beta$ denotes the regularization parameter coefficient ranging from 0.001 to 0.005, I denotes the identity matrix, and i denotes the position of the measurement point; The reconstructed waveform is expressed as:

$$Z^* = \zeta \cdot G$$

Where Z* represents the reconstructed waveform of PMG irregularity, G represents the chord measurement value matrix, and $\zeta$ represents the operator.

S4, Determining gap sensor positions based on the optimal chord measurement configuration of the multi-point chord system, and deploying an array of Hall effect sensors along the direction of magnetic field intensity measurement;

The optimal chord measurement configuration, which determines the optimal sensor installation positions, should satisfy the following criteria: (1) The greatest common divisor of the intervals between adjacent measurement points should be 1, ensuring the stability of the measurement system and the subsequent inversion model, thus guaranteeing the accuracy of chord values and reconstructed guideway irregularities; (2) Maximize the detectable wavelength while fulfilling measurement precision requirements, thereby ensuring the applicability of measurement results; (3) Satisfy measurement error requirements, ensuring the accuracy of measurement outcomes;

The pertinent equations are presented as follows:

$$\begin{cases} d = GCD(o_1 p_1, p_1 p_2, p_2 p_3, \ldots, p_{j-1} p_j \ldots, p_{n-1} o_2) = 1 \\ \min(z_e) \\ \min_\lambda \sigma - \sigma_k \end{cases}$$

In which d denotes the greatest common divisor of measurement point spacings, GCD is the function for computing the greatest common divisor, min is the function for determining the minimum value, $Z_e$ signifies the error in the reconstructed guideway irregularity waveform, $\sigma$ represents the standard deviation of the error waveform under the specified measurement precision, $\sigma_k$ denotes the standard deviation of the error waveform when the detectable wavelength is $\lambda$, and the formula for $\sigma_k$ is given by:

$$\sigma_k = \sqrt{\frac{\frac{1}{2\pi}\sum_{j=1}^{n-1}\left(\frac{z_j^2}{2\cdot\Delta s \cdot (n-1)}\right)}{N}}$$

In which $Z_j$ denotes the amplitude of the error waveform at location j, $\Delta s$ represents the sampling step size, n−1 signifies the number of wavelength domain partitions, and N is the length of the error waveform.

For this embodiment, the measurement objective is the vertical magnetic field intensity at a height of 10 mm above the PMG's upper surface. Gap sensors are positioned in accordance with the optimal chord measurement configuration, while Hall sensors are vertically aligned at each measurement point.

A Hall sensor measurement matrix B is obtained after placing j Hall sensors at each measurement point position;

$$B = \begin{bmatrix} B_{1,1} & B_{1,2} & \cdots & B_{1,j} \\ B_{2,1} & B_{2,2} & \cdots & B_{2,j} \\ \vdots & \vdots & \vdots & \vdots \\ B_{n-1,1} & B_{n-1,2} & \vdots & B_{n-1,j} \end{bmatrix}$$

Where $B_{n-1,j}$ denotes the measurement value of the j-th sensor in the measurement direction at measurement point n−1.

S5. Adjusting the reference datum position using the vertical displacement of the chord baseline, and calculating the magnetic field intensity distribution at any height above the reference datum using interpolation techniques based on Hall effect sensor readings.

in step S5, the adjusted reference datum position is determined by subtracting the vertical displacement from the initial position of the chord baseline, and the magnetic field intensity distribution at any arbitrary height above the reference datum is computed using interpolation techniques based on the Hall effect sensor readings. The mathematical expression is as follows:

$$R^* = R - Z^*$$

$$B^* = interpl(R^*, B, s)$$

Where R* denotes the adjusted chord baseline position, R denotes the initial position, and B* denotes the interpolated magnetic field intensity at position S along the measurement direction.

For computing the vertical magnetic field intensity 10 mm above the reference baseline, B*=interpl(R*,B,10) denotes the interpolated vertical magnetic field intensity at a distance of 10 mm from the reference plane.

Figure 2:
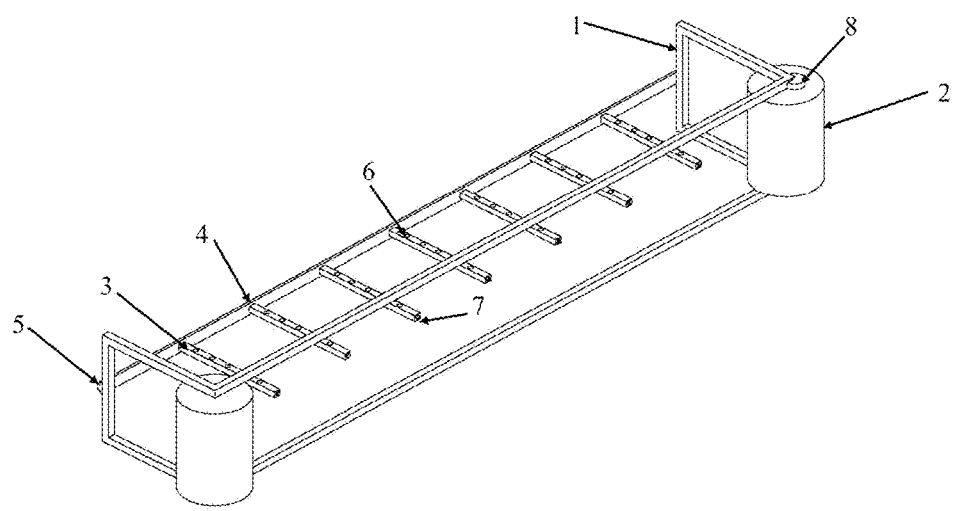
FIG. 2 illustrates the magnetic field intensity measurement apparatus positioned above the PMG of the high-temperature superconducting maglev transportation system in the embodiment of this invention.
Figure 3:
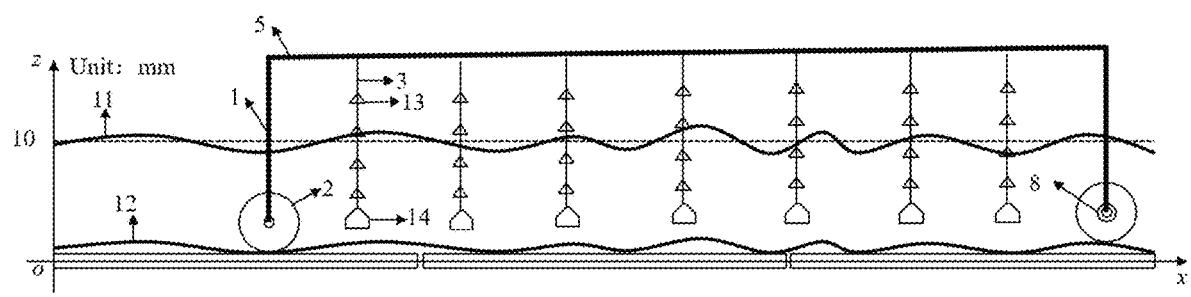
FIG. 3 showcases the magnetic field intensity measurement apparatus situated above the PMG of the high-temperature superconducting maglev transportation system in the embodiment of this invention.
Figure 4:
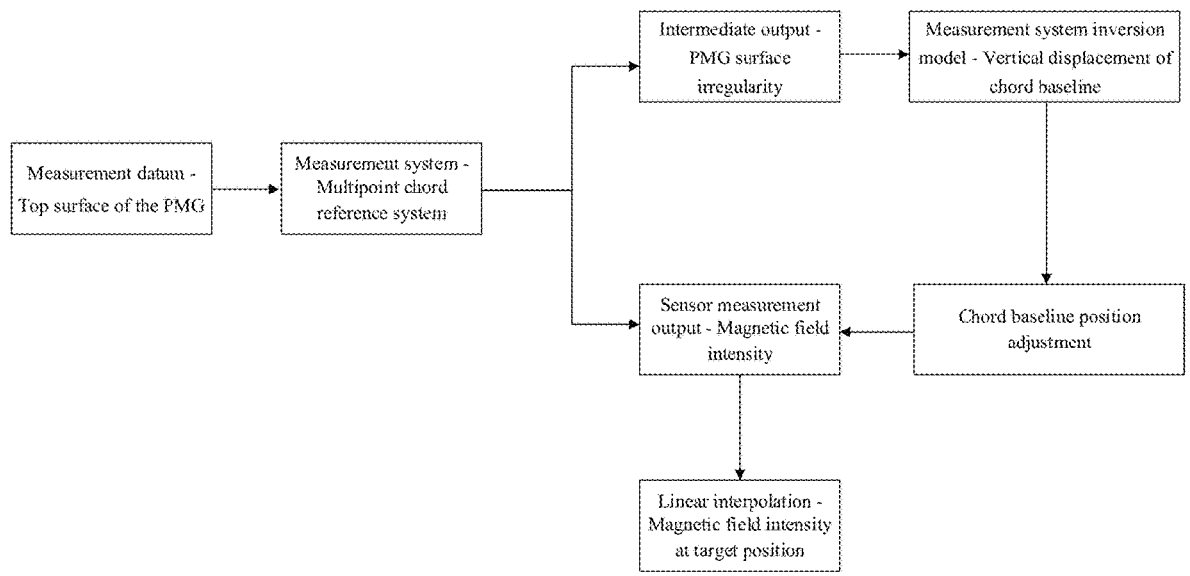
FIG. 4 demonstrates the measurement process for magnetic field intensity at any location above the PMG of the high-temperature superconducting maglev transportation system in the embodiment of this invention.

In this embodiment, based on the proposed optimal chord measurement configuration, an apparatus for detecting the vertical magnetic field intensity above the PMG of high-temperature superconducting maglev transportation systems was devised, with the specific design illustrated in FIG. 2. Component 7 comprises gap sensor mounting apertures (aligned with the optimal chord measurement configuration) for installing gap sensors 14 (utilized to detect and collect the gap from the measurement surface); component 6 consists of Hall sensor mounting apertures, employed to vertically arrange Hall sensors 13 (for measuring vertical magnetic field intensity). Following the calculation of chord values and reconstruction of the PMG irregularity waveform through step S3, the reference plane is adjusted via step S5, and the vertical magnetic field intensity 10 mm above the PMG is computed. In the vertical magnetic field intensity measurement scheme above the PMG of the high-temperature superconducting maglev system depicted in FIG. 3, the measurement apparatus can traverse along the PMG surface. Throughout this process, the encoder can trigger the data acquisition card at equidistant pulse intervals to record gap sensor measurements, while concurrently uploading the acquired values to the host computer for subsequent offline analysis. The aforementioned measurement outcomes can be utilized for evaluating PMG magnetic field intensity irregularities and optimizing PMG positioning in high-temperature superconducting maglev systems, with the detailed procedure illustrated in FIG. 4.

For the purpose of scientifically preserving the functional components of high-temperature superconducting maglev transportation systems and maintaining their levelness, thus fulfilling the requirements for safe, stable, and comfortable operation of high-speed maglev trains, and based on the same inventive concept as the aforementioned method embodiment, this invention additionally presents a magnetic field intensity measurement apparatus for high-temperature superconducting maglev transportation systems. This apparatus can be employed to execute the magnetic field intensity measurement method for high-temperature superconducting maglev transportation systems delineated in this invention.

Additionally, this embodiment introduces an apparatus for assessing the smoothness of magnetic field intensity distribution above the PMG in high-temperature superconducting maglev transportation systems. As illustrated in FIG. 2, the apparatus comprises a trolley main frame 1, running wheels 2, sensor mounting bracket 3, measurement chord mounting bracket 4, measurement chord 5, Hall sensor mounting apertures 6, gap sensor mounting apertures 7, and an encoder 8. The apparatus's running wheels 2 are attached to the trolley main frame 1 through bearings, with the encoder 8 also connected to the bearings and rotating coaxially. The measurement chord 5 is affixed to the measurement chord mounting bracket 4, which is joined to the trolley main frame 1. The Hall sensor mounting apertures 6 and gap sensor mounting apertures 7 are situated on the sensor mounting bracket 3.

Trolley main frame 1: This serves as the primary structure of the apparatus, to which all other hardware elements are attached, as detailed in FIG. 2.

Running wheels 2: The apparatus features two running wheels, one at the front and one at the rear, which are attached to the trolley main frame through bearings. These enable the apparatus to traverse the PMG surface at velocities up to 3 m/s.

Sensor mounting bracket 3: This component is chiefly employed for mounting gap sensors and Hall sensors, and is welded to the trolley main frame.

Measurement chord mounting bracket 4: This component primarily serves to fix the measurement chord in place (it must provide adequate rigidity) and is welded to the trolley main frame.

Measurement chord 5: A measurement chord with specified bending stiffness is manufactured according to the optimal chord measurement configuration. This chord is either welded or bolted into the measurement chord mounting bracket.

Hall sensor mounting apertures 6: These are utilized to secure the Hall sensors 13 responsible for measuring magnetic field intensity. It is crucial to select suitable Hall sensors and ensure precise installation.

Gap sensor mounting apertures 7: These are utilized to affix gap sensors 14 for measuring surface irregularities of the PMG's upper surface. It is crucial to choose suitable gap sensors and guarantee precision in their installation.

Encoder 8: This component rotates coaxially with the trolley bearings and can activate the data acquisition card at equidistant intervals along the measurement apparatus's advancement direction based on encoder pulses. This records distance information, ensuring that sensor gap values correlate with mileage, which aids in subsequent data analysis.

The apparatus conceived in this invention enables the measurement of magnetic field intensity at any location above the PMG in high-temperature superconducting maglev transportation systems. This apparatus is characterized by its light weight, ease of disassembly and transportation, controllable costs, and economic efficiency. This invention introduces, for the first time, the application of the multi-point chord measurement technique to high-temperature superconducting maglev systems. In comparison with conventional inertial reference methods, this approach provides superior measurement accuracy, enhanced stability, and improved resistance to external disturbances. It is particularly noteworthy that while the measurement apparatus experiences substantial impacts when traversing PMG joints, the measurement precision of the multi-point chord method remains unaffected by these vibrations.

While the preceding description provides detailed explanations of certain embodiments of this invention, those of ordinary skill in the relevant field may modify the technical solutions described in the aforementioned embodiments or make equivalent substitutions for some technical features. Any such modifications, equivalent substitutions, improvements, etc., made within the spirit and principles of this invention should be considered as falling within the protective scope of this invention.

What is claimed:

1. A magnetic field intensity measurement method for high-temperature superconducting maglev transportation systems, characterized by comprising the following steps:
   S1. Establishing the top surface of the permanent magnet guideway (PMG) as the reference datum for magnetic field intensity measurements;
   S2. Developing a chord-based multi-point measurement system to detect surface irregularities of the PMG, with system parameters including sampling interval, system order, and chord measurement configuration;
   S3. Computing chord measurement values for multiple intermediate points using data from the multi-point chord measurement system, and constructing an inversion model for the measurement system employing the least squares method; the inversion model is used to reconstruct the original track irregularity waveform from chord-based measurements, where the reconstructed track irregularity represents the vertical displacement of the chord baseline;
   S4. Determining gap sensor positions based on the optimal chord measurement configuration of the multi-point chord system, and deploying an array of Hall effect sensors along the direction of magnetic field intensity measurement;
   S5. Adjusting the reference datum position using the vertical displacement of the chord baseline, and calculating the magnetic field intensity distribution at any height above the reference datum using interpolation techniques based on Hall effect sensor readings;

In step S3, the formula for calculating chord measurement values for multiple intermediate measurement points based on the multi-point chord measurement system data is expressed as:

$$G = H \cdot Z_z$$

In which G denotes the chord measurement value matrix, H denotes the measurement matrix, and $Z_z$ denotes the irregularity vector matrix of the PMG;

The chord measurement value matrix G is represented as:

$$G = \begin{bmatrix} G(1) \\ G(2) \\ \vdots \\ G(n-1) \end{bmatrix} = \begin{bmatrix} g_{1,0} & g_{1,1} & \cdots & g_{1,i} & \cdots & g_{1,N-n-1} \\ g_{2,0} & g_{2,1} & \cdots & g_{2,i} & \cdots & g_{1,N-n-1} \\ \vdots & \vdots & \ddots & \vdots & \vdots & \vdots \\ g_{n-1,0} & g_{n-1,1} & \cdots & g_{n-1,i} & \cdots & g_{n-1,N-n-1} \end{bmatrix}_{(n-1)\times(N-n)}$$

Where G(i) denotes all chord values of measurement points when the chord baseline begins at measurement point i, and $g_{n-1,i}$ denotes the chord value of measurement point n−1 when the chord baseline begins at measurement point i;

The fully configured measurement matrix H for the chord baseline is presented as:

$$H = \begin{bmatrix} h_1[k] \\ h_2[k] \\ \vdots \\ h_{n-1}[k] \end{bmatrix} = \begin{bmatrix} \gamma_1 & 1 & \cdots & \overline{\gamma_1} \\ \gamma_2 & 1 & \cdots & \overline{\gamma_2} \\ \vdots & & \ddots & \vdots \\ \gamma_{n-1} & \cdots & 1 & \overline{\gamma_{n-1}} \end{bmatrix}_{(n-1)\times(n+1)}$$

The measurement matrix H contains n−1 rows and n+1 columns, with the number of rows corresponding to the number of measurement points in the full configuration, and the number of columns matching the dimension of the irregularity vector covered by the chord baseline, including endpoints; $h_{n-1}[k]$ is the convolution kernel for measurement point n−1, with elements in the 1st and n+1 columns corresponding to the split ratios $\gamma_i$ and $\overline{\gamma_i}$ of measurement point i, while the middle columns from the 2nd to the n form an identity matrix of dimension n−1;

The PMG irregularity vector matrix $Z_z$ corresponding to each column of the chord measurement value matrix G is expressed as:

$$Z_Z = \begin{bmatrix} z_0 & z_1 & \cdots & z_i & \cdots & z_{N-n-1} \\ z_1 & z_2 & \cdots & z_{i+1} & \cdots & z_{N-n} \\ \vdots & \vdots & \ddots & \vdots & \ddots & \vdots \\ z_n & z_{n+1} & \cdots & z_{i+1} & \cdots & z_{N-1} \end{bmatrix}$$

Where $Z_i$ represents the irregularity vector corresponding to the chord baseline position i.

2. The magnetic field intensity measurement method for high-temperature superconducting maglev transportation systems as stated in claim 1, characterized in that: in step S2, the system sampling interval is $\Delta s$, and the formula for computing the system order is as follows:

$$\gamma = L/\Delta s$$

Where $\gamma$ denotes the system order, L denotes the system chord length, and $\Delta s$ denotes the sampling step size.

3. The method for measuring magnetic field intensity in a high-temperature superconducting maglev transportation system as claimed in claim 1, characterized in that: an inversion model is established using the least squares method, which is subsequently employed to reconstruct the guideway irregularity waveform; during this process, the optimal solution is derived under the condition of best approximating the guideway track irregularity, thus ensuring the accuracy of the measurement results; the formula for deriving the optimal solution is as follows:

$$\min_{z} \frac{1}{2} \| H \cdot Z^* - G \|^2$$

Where H denotes the measurement matrix, G denotes the chord measurement value matrix, and Z* denotes the optimal solution, which is the reconstructed waveform of the PMG (Permanent Magnet Guideway) irregularity.

4. The method for measuring magnetic field intensity in a high-temperature superconducting maglev transportation system as claimed in claim 1, characterized in that: an operator $\zeta$ is incorporated into the inversion model of the measurement system to ensure solution stability and generate Z*, the reconstructed waveform of PMG irregularity; the operator expression is defined as:

$$\zeta = \left( \sum_{i=1}^{k} H_i^T H_i + \beta I \right)^{-1} \cdot \sum_{i=1}^{k} H_i^T$$

Where H denotes the measurement matrix, T denotes the matrix transpose operation, $\beta$ denotes the regularization parameter coefficient ranging from 0.001 to 0.005, I denotes the identity matrix, and i denotes the position of the measurement point;

The reconstructed waveform is expressed as:

$$Z^* = \zeta \cdot G$$

Where Z represents the reconstructed waveform of PMG irregularity, G represents the chord measurement value matrix, and $\zeta$ represents the operator.

5. The method for measuring magnetic field intensity in a high-temperature superconducting maglev transportation system as claimed in claim 1, characterized in that: in step S4, gap sensor positions are determined based on the optimal chord measurement configuration of the multi-point chord system, and an array of Hall effect sensors is deployed along the direction of magnetic field intensity measurement; a Hall sensor measurement matrix B is obtained after placing j Hall sensors at each measurement point position;

$$B = \begin{bmatrix} B_{1,1} & B_{1,2} & \cdots & B_{1,j} \\ B_{2,1} & B_{2,2} & \cdots & B_{2,j} \\ \vdots & \vdots & \vdots & \vdots \\ B_{n-1,1} & B_{n-1,2} & \vdots & B_{n-1,j} \end{bmatrix}$$

Where $B_{n-1,j}$ denotes the measurement value of the j-th sensor in the measurement direction at measurement point n−1.

6. The method for measuring magnetic field intensity in a high-temperature superconducting maglev transportation system as claimed in claim 1, characterized in that: in step S5, the adjusted reference datum position is determined by subtracting the vertical displacement from the initial position of the chord baseline, and the magnetic field intensity distribution at any arbitrary height above the reference datum is computed using interpolation techniques based on the Hall effect sensor readings; the mathematical expression is as follows:

$$R^* = R - Z^*$$

$$B^* = interpl(R^*, B, s)$$

Where R* denotes the adjusted chord baseline position, R denotes the initial position, and B* denotes the interpolated magnetic field intensity at position S along the measurement direction.

7. A measurement apparatus fabricated according to the magnetic field intensity measurement method for high-temperature superconducting maglev transportation systems as described in claim 1, characterized in that: the said measurement apparatus includes:

A trolley main frame (1), running wheels (2), sensor mounting bracket (3), measurement chord mounting bracket (4), measurement chord (5), Hall sensor mounting apertures (6), gap sensor mounting apertures (7), and an encoder (8);

The running wheels (2) are attached to the trolley main frame (1) through bearings; both the sensor mounting bracket (3) and the measurement chord mounting bracket (4) are rigidly affixed to the trolley main frame (1); the sensor mounting bracket (3) features Hall sensor mounting apertures (6) for secure installation of Hall sensors (13) and gap sensor mounting apertures (7) for secure installation of gap sensors (14); the measurement chord (5) is rigidly attached to the measurement chord mounting bracket (4); the encoder (8) is linked to the bearing and rotates coaxially with it.

\* \* \* \* \*